(12) United States Patent
Carey et al.

(10) Patent No.: US 8,576,519 B1
(45) Date of Patent: Nov. 5, 2013

(54) CURRENT-PERPENDICULAR-TO-THE-PLANE (CPP) MAGNETORESISTIVE (MR) SENSOR WITH MAGNETIC DAMPING MATERIAL AT THE SENSOR EDGES

(71) Applicant: HGST Netherlands B.V., Amsterdam (NL)

(72) Inventors: Matthew J. Carey, San Jose, CA (US); Jeffrey R. Childress, San Jose, CA (US); Young-suk Choi, Los Gatos, CA (US); John Creighton Read, San Jose, CA (US)

(73) Assignee: HGST Netherlands B.V., Amsterdam (NL)

( * ) Notice: Subject to any disclaimer, the term of this patent is extended or adjusted under 35 U.S.C. 154(b) by 0 days.

(21) Appl. No.: 13/649,245

(22) Filed: Oct. 11, 2012

(51) Int. Cl.
*G11B 5/39* (2006.01)

(52) U.S. Cl.
USPC .................................... 360/324; 360/324.2

(58) Field of Classification Search
USPC ............ 360/313–327.33; 365/158, 171, 173; 324/207.21, 252; 428/811–811.5, 611; 148/108; 257/295, 296, 414, 421; 438/3
See application file for complete search history.

(56) References Cited

U.S. PATENT DOCUMENTS

| | | | | |
|---|---|---|---|---|
| 7,057,921 | B2* | 6/2006 | Valet | 365/158 |
| 7,088,609 | B2* | 8/2006 | Valet | 365/158 |
| 7,245,462 | B2* | 7/2007 | Huai et al. | 360/324.11 |
| 7,423,850 | B2 | 9/2008 | Gill et al. | |
| 7,522,387 | B2 | 4/2009 | Yoshida | |
| 7,765,675 | B2 | 8/2010 | Childress et al. | |
| 7,821,748 | B2* | 10/2010 | Fukuzawa et al. | 360/324.2 |
| 7,957,107 | B2 | 6/2011 | Carey et al. | |
| 8,203,808 | B2* | 6/2012 | Mizuno et al. | 360/324.12 |
| 8,203,809 | B2 | 6/2012 | Zhou et al. | |
| 8,233,247 | B2 | 7/2012 | Carey et al. | |
| 8,238,135 | B2* | 8/2012 | Suzuki et al. | 365/80 |
| 8,462,461 | B2* | 6/2013 | Braganca et al. | 360/125.3 |
| 2006/0221512 | A1* | 10/2006 | Gill et al. | 360/324.12 |
| 2009/0257154 | A1 | 10/2009 | Carey et al. | |
| 2012/0129008 | A1* | 5/2012 | Fukuzawa et al. | 428/811.2 |
| 2013/0009712 | A1* | 1/2013 | Braganca et al. | 331/94.1 |

* cited by examiner

*Primary Examiner* — Will J Klimowicz
(74) *Attorney, Agent, or Firm* — Thomas R. Berthold

(57) ABSTRACT

A current-perpendicular-to-the-plane magnetoresistive sensor has magnetic damping material located adjacent either or both of the sensor side edges and back edge to reduce the effect of spin transfer torque. The damping material may be Pt, Pd, Os, or a rare earth metal from the 15 lanthanoid elements. The damping material may be an ultrathin layer in contact with the sensor edges. An insulating layer is deposited on the damping layer and isolates the sensor's ferromagnetic biasing layer from the damping layer. Instead of being a separate layer, the damping material may be formed adjacent the sensor edges by being incorporated into the material of the insulating layer.

18 Claims, 4 Drawing Sheets

US 8,576,519 B1

CURRENT-PERPENDICULAR-TO-THE-PLANE (CPP) MAGNETORESISTIVE (MR) SENSOR WITH MAGNETIC DAMPING MATERIAL AT THE SENSOR EDGES

BACKGROUND OF THE INVENTION

1. Field of the Invention

The invention relates generally to a current-perpendicular-to-the-plane (CPP) giant magnetoresistive (GMR) sensor that operates with the sense current directed perpendicularly to the planes of the layers making up the sensor stack, and more particularly to a CPP-GMR sensor with magnetic damping to suppress spin transfer torque (STT).

2. Background of the Invention

One type of conventional magnetoresistive (MR) sensor used as the read head in magnetic recording disk drives is a "spin-valve" sensor based on the giant magnetoresistance (GMR) effect. A GMR spin-valve sensor has a stack of layers that includes two ferromagnetic layers separated by a nonmagnetic electrically conductive spacer layer, which is typically copper (Cu) or silver (Ag). One ferromagnetic layer adjacent the spacer layer has its magnetization direction fixed, such as by being pinned by exchange coupling with an adjacent antiferromagnetic layer, and is referred to as the reference layer. The other ferromagnetic layer adjacent the spacer layer has its magnetization direction free to rotate in the presence of an external magnetic field and is referred to as the free layer. With a sense current applied to the sensor, the rotation of the free-layer magnetization relative to the reference-layer magnetization due to the presence of an external magnetic field is detectable as a change in electrical resistance. If the sense current is directed perpendicularly through the planes of the layers in the sensor stack, the sensor is referred to as a current-perpendicular-to-the-plane (CPP) sensor.

CPP-GMR sensors are susceptible to current-induced noise and instability. The spin-polarized bias or sense current flows perpendicularly through the ferromagnetic layers and produces a spin transfer torque (STT) on the local magnetization. This can produce magnetic instabilities and even continuous gyrations of the magnetization in the ferromagnetic layers, resulting in substantial low-frequency magnetic noise in the measured electrical resistance if the bias current is above a certain level. This effect is described by J.-G. Zhu et al., "Spin transfer induced noise in CPP read heads," *IEEE Transactions on Magnetics*, Vol. 40, January 2004, pp. 182-188. To maximize the signal and signal-to-noise ratio (SNR) in CPP-GMR sensors, it is desirable to operate the sensors at a high bias current density. However, the adverse effect of STT limits the bias current at which the sensors can operate. Both the free layer and reference layers in the sensor are susceptible to STT, and therefore the layer with the highest sensitivity to STT will typically limit the performance of the sensor. One proposal to alleviate this problem to some degree is to increase the magnetic damping of the ferromagnetic layers, i.e., to increase the effective thermal coupling between the magnetization (spin-system) and that of its host lattice. With sufficient damping, the magnetic layer with magnetization excitations caused by STT will lose energy to the lattice faster than it can absorb energy from the bias current via STT.

U.S. Pat. No. 7,423,850 B2, assigned to the same assignee as this application, describes a CPP-GMR sensor with an antiparallel free layer (AP-free) structure, i.e., two free layers with magnetizations oriented antiparallel across a Ru spacer layer, wherein one of the free layers includes a NiFeTb film for magnetic damping of the other free layer across the Ru spacer layer. U.S. Pat. No. 8,233,247 B2, assigned to the same assignee as this application, describes a scissoring-type CPP-GMR sensor wherein each of the two free layers is in contact with a magnetic damping layer formed or Pt, Pd or a lanthanoid.

However, among the most vulnerable parts of the sensor to STT are the magnetic layer edges where canted or loose spins may be more readily excited due to their non-collinear orientation with either the free layer or the pinned layer. What is needed is a CPP-GMR sensor with increased magnetic damping at the sensor edges to suppress STT at the most sensitive areas of the sensor without reducing the sensor signal near the center of the sensor.

SUMMARY OF THE INVENTION

The invention relates to CPP sensors with magnetic damping material to reduce the effect of spin transfer torque (STT). Magnetic damping material is located adjacent either or both of the sensor side edges and back edge. The damping material may be platinum (Pt), palladium (Pd), osmium (Os), or a rare earth metal from the 15 lanthanoid (formerly called "lanthanide") elements. The damping material may be an ultrathin layer in contact with the sensor edges. An insulating layer is deposited on the damping layer and isolates the sensor's ferromagnetic biasing layer from the damping layer. The damping layer is ultrathin to not cause significant electrical shunting or signal degradation. Instead of being a separate layer, the damping material may be formed adjacent the sensor edges by being incorporated into the material of the insulating layer. For example, the material of the insulating layer may be doped with the damping material in an amount less than 20 atomic percent. If the damping material is incorporated into the insulating layer, rather than being a layer in contact with the sensor edges, it will not form an electrical shunting path, which eliminates the concern of making the separate damping layer ultrathin.

For a fuller understanding of the nature and advantages of the present invention, reference should be made to the following detailed description taken together with the accompanying figures.

DETAILED DESCRIPTION OF THE INVENTION

Figure 1:
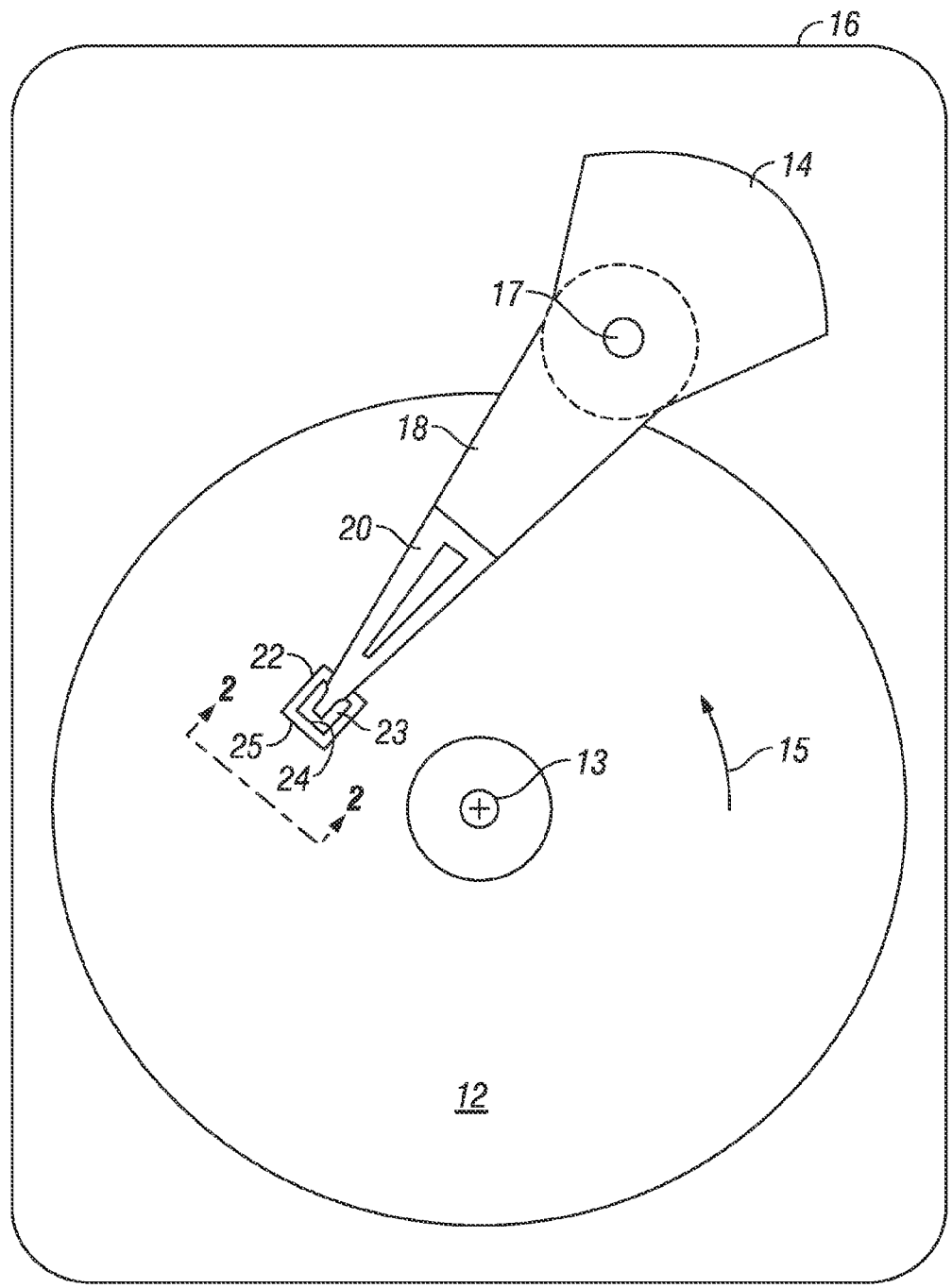
FIG. 1 is a schematic top view of a conventional magnetic recording hard disk drive with the cover removed.

The CPP giant magnetoresistive (GMR) sensor of this invention has application for use in a magnetic recording disk drive, the operation of which will be briefly described with reference to FIGS. 1-3. FIG. 1 is a block diagram of a conventional magnetic recording hard disk drive. The disk drive includes a magnetic recording disk 12 and a rotary voice coil motor (VCM) actuator 14 supported on a disk drive housing or base 16. The disk 12 has a center of rotation 13 and is rotated in direction 15 by a spindle motor (not shown) mounted to base 16. The actuator 14 pivots about axis 17 and includes a rigid actuator arm 18. A generally flexible suspension 20 includes a flexure element 23 and is attached to the end of arm 18. A head carrier or air-bearing slider 22 is attached to the flexure 23. A magnetic recording read/write head 24 is formed on the trailing surface 25 of slider 22. The flexure 23 and suspension 20 enable the slider to "pitch" and "roll" on an air-bearing generated by the rotating disk 12. Typically, there are multiple disks stacked on a hub that is rotated by the spindle motor, with a separate slider and read/write head associated with each disk surface.

Figure 2:
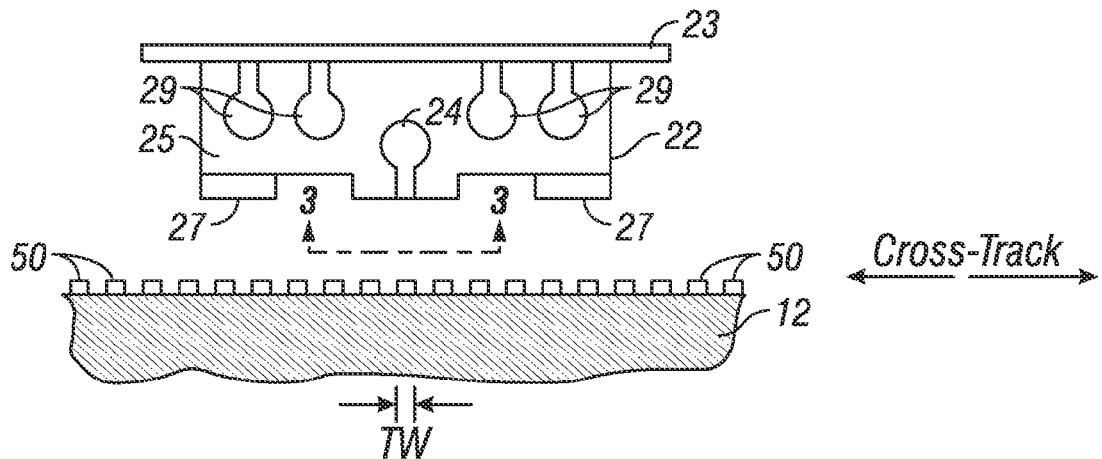
FIG. 2 is an enlarged end view of the slider and a section of the disk taken in the direction 2-2 in FIG. 1.

FIG. 2 is an enlarged end view of the slider 22 and a section of the disk 12 taken in the direction 2-2 in FIG. 1. The slider 22 is attached to flexure 23 and has an air-bearing surface (ABS) 27 facing the disk 12 and a trailing surface 25 generally perpendicular to the ABS. The ABS 27 causes the airflow from the rotating disk 12 to generate a bearing of air that supports the slider 22 in very close proximity to or near contact with the surface of disk 12. The read/write head 24 is formed on the trailing surface 25 and is connected to the disk drive read/write electronics by electrical connection to terminal pads 29 on the trailing surface 25. As shown in the sectional view of FIG. 2, the disk 12 is a patterned-media disk with discrete data tracks 50 spaced-apart in the cross-track direction, one of which is shown as being aligned with read/write head 24. The discrete data tracks 50 have a track width TW in the cross-track direction and may be formed of continuous magnetizable material in the circumferential direction, in which case the patterned-media disk 12 is referred to as a discrete-track-media (DTM) disk. Alternatively, the data tracks 50 may contain discrete data islands spaced-apart along the tracks, in which case the patterned-media disk 12 is referred to as a bit-patterned-media (BPM) disk. The disk 12 may also be a conventional continuous-media (CM) disk wherein the recording layer is not patterned, but is a continuous layer of recording material. In a CM disk the concentric data tracks with track width TW are created when the write head writes on the continuous recording layer.

Figure 3:
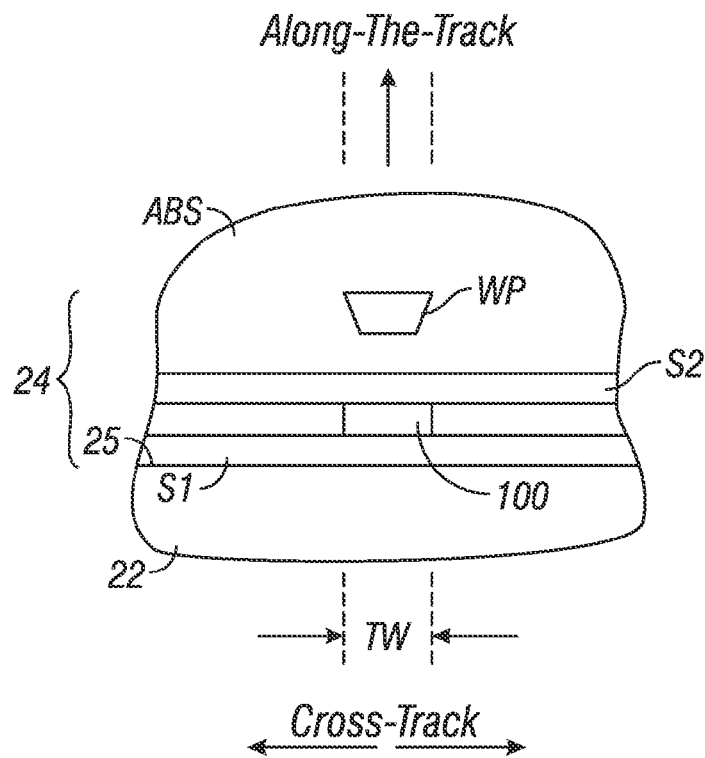
FIG. 3 is a view in the direction 3-3 of FIG. 2 and shows the ends of the read/write head as viewed from the disk.

FIG. 3 is a view in the direction 3-3 of FIG. 2 and shows the ends of read/write head 24 as viewed from the disk 12. The read/write head 24 is a series of thin films deposited and lithographically patterned on the trailing surface 25 of slider 22. The write head includes a perpendicular magnetic write pole (WP) and may also include trailing and/or side shields (not shown). The CPP-GMR sensor or read head 100 is located between two magnetic shields S1 and S2. The shields S1, S2 are formed of magnetically permeable material, typically a NiFe alloy, and may also be electrically conductive so they can function as the electrical leads to the read head 100. The shields function to shield the read head 100 from recorded data bits that are neighboring the data bit being read. Separate electrical leads may also be used, in which case the read head 100 is formed in contact with layers of electrically conducting lead material, such as tantalum, gold, or copper, that are in contact with the shields S1, S2. FIG. 3 is not to scale because of the difficulty in showing very small dimensions. Typically each shield S1, S2 is several microns thick in the along-the-track direction, as compared to the total thickness of the read head 100 in the along-the-track direction, which may be in the range of 20 to 40 nm.

Figure 4A:
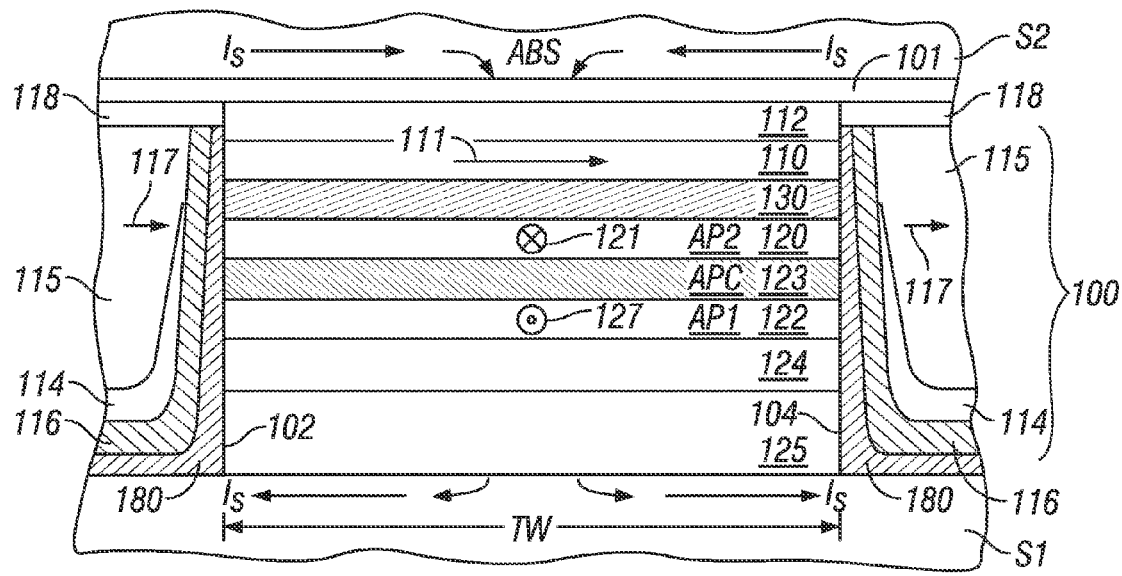
FIG. 4A is a cross-sectional schematic view of a CPP-GMR read head structure according to the invention.

FIG. 4A is view of the ABS showing the layers making up a CPP-GMR sensor structure as would be viewed from the disk. FIG. 4A will be used to describe the prior art sensor structure as well as the sensor structure according to this invention. Sensor 100 is a CPP-GMR read head comprising a stack of layers formed between the two magnetic shield layers S1, S2. The sensor 100 has a front edge at the ABS and spaced-apart side edges 102, 104 that define the track width (TW). The shields S1, S2 are formed of electrically conductive material and thus may also function as electrical leads for the sense current $I_S$, which is directed generally perpendicularly through the layers in the sensor stack. Alternatively, separate electrical lead layers may be formed between the shields S1, S2 and the sensor stack. The lower shield S1 is typically polished by chemical-mechanical polishing (CMP) to provide a smooth substrate for the growth of the sensor stack. A seed layer 101, such as a thin Ru/NiFe bilayer, is deposited, typically by sputtering, below S2 to facilitate the electroplating of the relatively thick S2.

The sensor 100 layers include a reference ferromagnetic layer 120 having a fixed magnetic moment or magnetization direction 121 oriented transversely (into the page), a free ferromagnetic layer 110 having a magnetic moment or magnetization direction 111 that can rotate in the plane of layer 110 in response to transverse external magnetic fields from the disk 12, and a nonmagnetic spacer layer 130 between the reference layer 120 and free layer 110. The nonmagnetic spacer layer 130 is be formed of an electrically conducting material, typically a metal like Cu, Au or Ag or their alloys.

The pinned ferromagnetic layer in a CPP-GMR sensor may be a "simple-pinned" layer or the well-known antiparallel (AP) pinned structure like that shown in FIG. 4A. An AP-pinned structure has first (AP1) and second (AP2) ferromagnetic layers separated by a nonmagnetic antiparallel coupling (APC) layer with the magnetization directions of the two AP-pinned ferromagnetic layers oriented substantially antiparallel. The AP2 layer, which is in contact with the nonmagnetic APC layer on one side and the sensor's electrically nonmagnetic spacer layer on the other side, is typically referred to as the reference layer. The AP1 layer, which is typically in contact with an antiferromagnetic or hard magnet pinning layer on one side and the nonmagnetic APC layer on the other side, is typically referred to as the pinned layer. In FIG. 4A the AP-pinned structure has reference ferromagnetic layer 120 (AP2) and lower ferromagnetic layer 122 (AP1) that are antiferromagnetically coupled across AP coupling (APC) layer 123. The APC layer 123 is typically Ru, Ir, Rh, Cr or alloys thereof. The AP1 and AP2 layers, as well as the free ferromagnetic layer 110, are typically formed of crystalline CoFe or NiFe alloys, or a multilayer of these materials, such as a CoFe/NiFe bilayer. The AP1 and AP2 ferromagnetic layers have their respective magnetization directions 127, 121 oriented antiparallel. The AP1 layer 122 may have its magnetization direction pinned by being exchange-coupled to an antiferromagnetic (AF) layer 124 as shown in FIG. 4A. The AF layer 124 is typically a Mn alloy, e.g., PtMn, NiMn, FeMn, IrMn, PdMn, PtPdMn or RhMn. Alternatively, the AP-pinned structure may be "self-pinned" or it may be pinned by a hard magnetic layer such as $Co_{100-x}Pt_x$ or $Co_{100-x-y}Pt_xCr_y$ (where x is about between 8 and 30 atomic percent). Instead of being in contact with a hard magnetic layer, AP1 layer 122 by itself can be comprised of hard magnetic or high magnetostriction material so that it is in contact with an underlayer on one side and the nonmagnetic APC layer 123 on the other side. In a "self pinned" sensor the AP1 and AP2 layer magnetization directions 127, 121 are typically set generally perpendicular to the disk surface by magnetostriction and the residual stress that exists within the fabricated sensor. It is desirable that the AP1 and AP2 layers have similar moments. This assures that the net magnetic moment of the AP-pinned structure is small so that magnetostatic coupling to the free layer 110 is minimized and the effective pinning field of the AF layer 124, which is approximately inversely proportional to the net magnetization of the AP-pinned structure, remains high. In the case of a hard magnet pinning layer, the hard magnet pinning layer moment needs to be accounted for when balancing the moments of AP1 and AP2 to minimize magnetostatic coupling to the free layer. Instead of an AP-pinned structure, the reference layer may itself be pinned directly, without the use of an a APC layer or a separate pinned layer. In this case, usually referred to as a "simple-pinned" structure, reference layer 120 is directly in contact with an antiferromagnetic layer 124. Alternatively, this simple-pinned layer may be comprised of a hard magnet material, or in contact with a hard-magnet material.

A seed layer 125 may be located between the lower shield layer S1 and the AP-pinned structure. If AF layer 124 is used, the seed layer 125 enhances the growth of the AF layer 124. The seed layer 125 is typically one or more layers of NiFeCr, NiFe, Ta, Cu or Ru. A capping layer 112 is located between the free ferromagnetic layer 110 and the upper shield layer S2. The capping layer 112 provides corrosion protection and may be a single layer or multiple layers of different materials, such as Ru, Ta, Ti, or a Ru/Ta/Ru, Ru/Ti/Ru, or Cu/Ru/Ta trilayer. In addition, the capping layer may include a specific magnetic damping layer, such as Pt or a lanthanoid material, to further increase the magnetic damping of the free layer.

In the presence of an external magnetic field in the range of interest, i.e., magnetic fields from recorded data on the disk, the magnetization direction 111 of free layer 110 will rotate while the magnetization direction 121 of reference layer 120 will remain fixed and not rotate. Thus when a sense current $I_S$ is applied from top shield S2 perpendicularly through the sensor stack to bottom shield S1 (or from S1 to S2), the rotation of the free layer magnetization 111 due to magnetic fields from the recorded data on the disk will be detectable as a change in electrical resistance.

The free layer 110 may also consist of a multilayer known as a antiparallel (AP)-free layer, where two magnetic layers are coupled so that their magnetizations are antiparallel. In this case, the two magnetic layers are of unequal magnetizations, so that the antiparallel-coupled pair has a non-zero net magnetization. This net magnetization becomes the effective free layer magnetization which will respond to magnetic fields from recorded data on the disk.

A ferromagnetic biasing layer 115, such as a CoPt or CoCrPt hard magnetic bias layer, is also typically formed outside of the sensor stack near the side edges 102, 104 of the sensor 100. The biasing layer 115 is electrically insulated from side edges 102, 104 of sensor 100 by insulating layer 116. An optional seed layer 114, such as a Cr alloy like CrMo or CrTi, may be deposited on the insulating layer 116 to facilitate the growth of the biasing layer 115, particularly if the biasing layer is a CoPt or CoPtCr layer. A capping layer 118, such as layer of Cr, or a multilayer of Ta/Cr is deposited on top of the biasing layer 115. The upper layer of capping layer 118, for example Cr, also serves the purpose as a chemical-mechanical-polishing (CMP) stop layer during fabrication of the sensor. The biasing layer 115 has a magnetization 117 generally parallel to the ABS and thus longitudinally biases the magnetization 111 of the free layer 110. Thus in the absence of an external magnetic field its magnetization 117 is parallel to the magnetization 111 of the free layer 110. The ferromagnetic biasing layer 115 may be a hard magnetic bias layer or a ferromagnetic layer that is exchange-coupled to an antiferromagnetic layer.

Figure 4B:
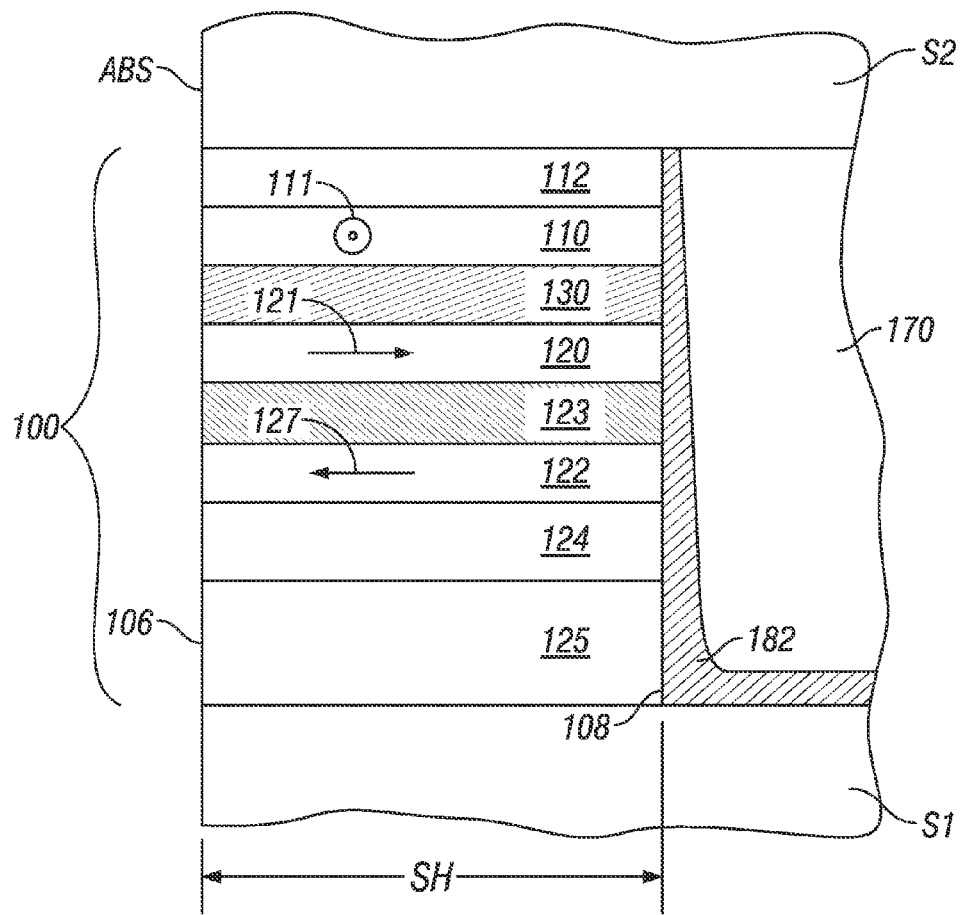
FIG. 4B is a sectional view of the CPP-GMR read head structure according to the invention taken through a plane orthogonal to both the ABS and to the planes of the layers in the sensor stack.

FIG. 4B is a sectional view of the CPP-GMR sensor structure of FIG. 4A taken through a plane orthogonal to both the ABS and to the planes of the layers in the sensor stack. The sensor 100 is thus depicted with the front edge 106 at the ABS and back edge 108 recessed from the ABS. The front and back edges 106, 108 define the stripe height (SH) of the sensor 100.

CPP-GMR sensors are susceptible to current-induced noise and instability. The bias or sense current is spin-polarized as it flows perpendicularly through the ferromagnetic layers and produces a spin transfer torque (STT) on the local magnetization of all the ferromagnetic layers in the sensor, including the free layer 110 and the reference layer 120, irrespective of current direction. As the bias current is increased, this can produce magnetic excitations, large-angle rotation or even continuous gyrations of the magnetization of the ferromagnetic layers, resulting in substantial magnetic noise. The edges of the free layer 110, i.e. the side edges 102, 104 in FIG. 4A and the back edge 108 in FIG. 4B, are the most vulnerable parts of the free layer to STT where canted or loose spins may be more readily excited. Similarly, the edges of the reference layer are most susceptible.

Thus in the CPP-GMR sensor of this invention magnetic damping material is located adjacent either or both of the sensor side edges 102, 104 and back edge 108. This is shown by damping layer 180 in FIG. 4A and damping layer 182 in FIG. 4B. The damping layers 180, 182 are formed of a material consisting essentially of platinum (Pt), palladium (Pd), osmium (Os), or a rare earth metal from the 15 lanthanoid (formerly called "lanthanide") elements. The lanthanoids are lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu). Pt and Pd are heavy elements with strong spin-orbit coupling, as described by Tserkovnyak et al., "Enhanced Gilbert Damping in Thin Ferromagnetic Films", *Phys Rev Lett*, Vol. 88, No. 11, 18 Mar. 2002, 117601. The preferred material for damping layers 180, 182 consists essentially of an element selected from Pt, Pd, Gd, Dy, Tb and Ho.

In FIG. 4A, the damping layer 180 is in contact with at least the side edges 102, 104 of the free layer 110 or the reference layer 120. The damping layer 180 may also be formed on the side edges of the other sensor 100 layers and on regions of shield S1 adjacent the side edges 102, 104. The insulating layer 116 and optional seed layer 114 isolate the ferromagnetic biasing layer 115 from the damping layer 180. In FIG. 4B, the damping layer 182 is in contact with at least the back edge 108 of the free layer 110 or the reference layer 120. The damping layer 182 may also be formed on the back edges of the other sensor 100 layers and on regions of shield S1 adjacent the back edge 108. An insulating layer 170 is in contact with the damping layer 182 at the back edge and at region of the shield S1 adjacent the back edge 108. Insulating layers 116 and 170 may be formed of single or multiple layers of materials like silicon-nitride ($SiN_x$), alumina ($Al_2O_3$), other insulating nitrides, or other metal oxides like a tantalum (Ta) oxide and a magnesium (Mg) oxide.

The damping layers 180, 182 are preferably ultrathin, i.e., a preferred thickness less than 10 Å. The damping layers may be continuous or discontinuous films. A discontinuous film may be considered to have an average thickness. As a discontinuous film, the damping layer material would only partially cover the free layer or reference layer edges, with the insulating layers being in contact with the free layer or reference layer edges not covered by the damping layer material. If the damping layer is sufficiently thin or discontinuous it will not cause significant electrical shunting or signal degradation but will improve the output of the sensor due to higher magnetic damping. This will result in higher achievable voltage bias with larger magnetoresistance before excessive STT induced excitations are observed. This effect will be more pronounced as the sensor size (TW and SH) is decreased because this increases the ratio of sensor edge surface area to sensor volume. Also, if the material selected for the damping layer is capable of forming an oxide, then there may be also be some oxides of the damping material formed adjacent the sensor side edges if the subsequently deposited insulating layers 116 and 170 are formed of alumina ($Al_2O_3$) or another oxide insulator.

Instead of being a separate layer, the damping material may be formed adjacent the sensor edges by being incorporated into the material of the insulating layer. For example, the insulating material for layers 116, 170 may be doped with small amounts of damping material. One example is $Al_2O_3$ doped with less than 20 atomic percent Dy. If the damping material is incorporated into the insulating layer, rather than being a layer in contact with the sensor edges it will not form an electrical shunting path, which eliminates the concern of making the separate damping layer ultrathin.

Figure 5:
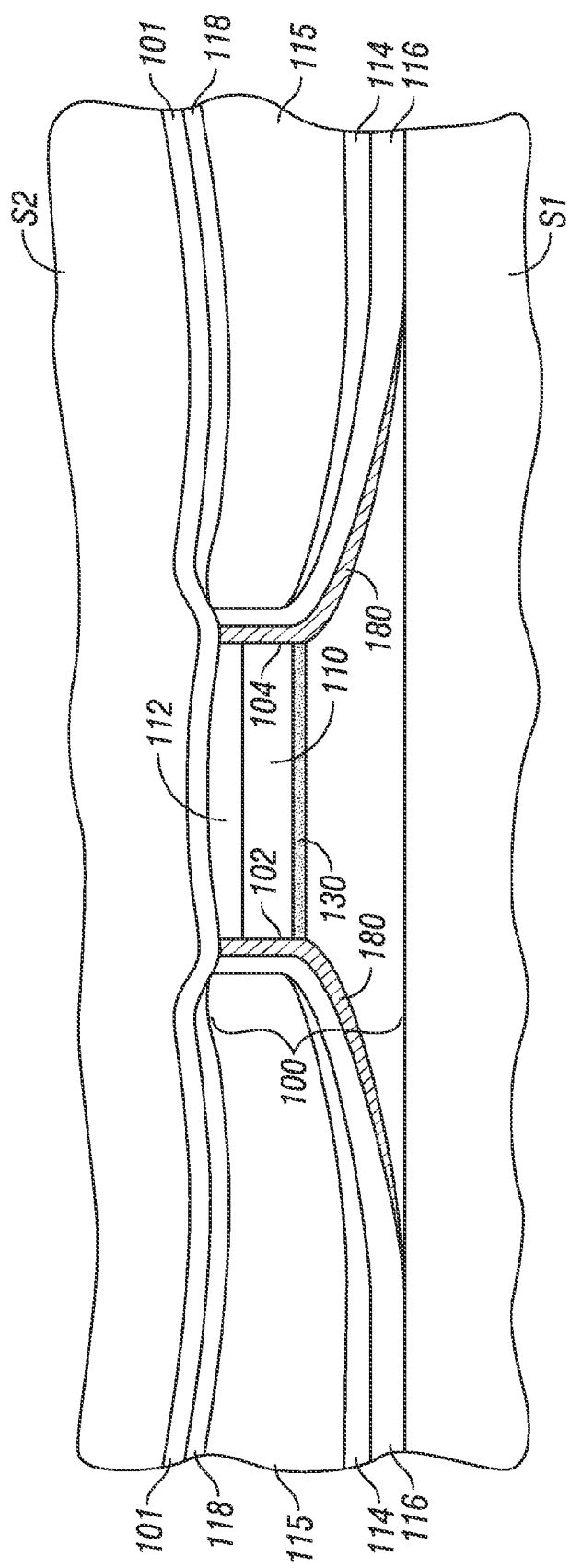
FIG. 5 is a line drawing representing an actual sensor as seen from the ABS for explaining the process steps for making the sensor of this invention.

The various fabrication methods and process steps for CPP-MR sensors are well-known and not part of this invention. FIG. 5 is a line drawing representing an actual sensor as seen from the ABS and will be used to briefly explain the process steps for making the sensor of this invention. First, all of the layers making up the sensor 100 stack are deposited as full films on S1. A hard mask material (not shown), like diamond-like carbon (DLC), is deposited over capping layer 112. A layer of photoresist (not shown) is then deposited on the DLC. The photoresist is then lithographically patterned to define the two side edges 102, 104 of the sensor 100. An ion milling step removes the layers outside the sensor side edges down to S1. The side regions are then refilled by deposition of the damping layer 180, insulating layer 116, optional seed layer 114 for the biasing layer 115, the biasing layer 115, and capping layer 118. A second DLC layer (not shown) is then deposited in the side regions over the capping layer 118. The photoresist and deposited material on top of the photoresist are then removed by chemical-mechanical-polishing (CMP) assisted lift-off down to the DLC layers. A reactive ion etching (RIE) step then removes the DLC. This leaves the capping layer 118 in the side regions and the capping layer 112 above the sensor stack. This is followed by top cap deposition of a seed layer 101, like Ru/NiFe, over both the sensor stack and the side regions, and then electroplating of S2 on layer 101.

The invention is directly applicable to CPP-GMR sensors because of the desire to increase damping at the sensor edges to minimize STT. However, the invention may also be beneficial in certain tunneling magnetoresistance (TMR) CPP sensors. CPP-TMR sensors are well-known and have a structure similar to the CPP-GMR sensor shown in FIGS. 4A-4B except that the spacer layer 130 is an insulating tunnel barrier layer like MgO. While it is actually beneficial to reduce magnetic damping in the free layer of TMR sensors to reduce noise, for TMR sensors with very low resistances, e.g., a resistance-area (RA) product less than 0.3 Ohm-$\mu m^2$, it may be desirable to increase damping at the sensor edges to reduce spin-torque-induced noise.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A magnetoresistive sensor structure for sensing magnetically recorded data from a magnetic recording medium, the structure comprising:
    a substrate;
    a first shield layer of magnetically permeable material on the substrate;
    a magnetoresistive sensor comprising a stack of layers on the first shield layer and having a front edge for facing a magnetic recording medium, a back edge recessed from the front edge, and two spaced-apart side edges that define a sensor track width (TW) at the front edge, the sensor being capable of sensing magnetically recorded data when a sense current is applied perpendicular to the planes of the layers in the sensor stack; and
    a damping layer on and in contact with the sensor side edges, the damping layer being formed of material selected from the group consisting of Pt, Pd, Os, La, Ce, Pr, Nd, Pm, Sm, Eu, Gd, Tb, Dy, Ho, Er, Th, Yb, and Lu; and
    an insulating layer on and in contact with the damping layer and on regions of the first shield layer adjacent the sensor side edges.

2. The sensor structure of claim 1 wherein the damping layer is also on and in contact with the first shield layer adjacent the sensor side edges.

3. The sensor structure of claim 1 wherein the thickness of the damping layer is less than 10 Å.

4. The sensor structure of claim 1 wherein the damping layer is a discontinuous film.

5. The sensor structure of claim 1 wherein the damping layer on and in contact with the side edges of the sensor is a first damping layer, and further comprising a second damping layer comprising a material selected from the group consisting of Pt, Pd, Os, La, Ce, Pr, Nd, Pm, Sm, Eu, Gd, Tb, Dy, Ho, Er, Th, Yb, and Lu on and in contact with the back edge of the sensor.

6. The sensor structure of claim 5 wherein the second damping layer is also on and in contact with the first shield layer adjacent the sensor back edge.

7. The sensor structure of claim 1 further comprising a ferromagnetic biasing layer on the insulating layer; and a second shield layer formed of magnetically permeable material on the sensor and ferromagnetic biasing layer.

8. The sensor structure of claim 7 wherein the ferromagnetic biasing layer is a layer of hard magnetic material comprising a CoPt alloy.

9. The sensor structure of claim 1 wherein the damping material consists essentially of an element selected from Pt, Pd, Gd, Dy, Tb and Ho.

10. The sensor structure of claim 1 wherein the sensor is a current-perpendicular-to-the-plane giant magnetoresistance (CPP-GMR) sensor.

11. The sensor structure of claim 1 wherein the sensor is a current-perpendicular-to-the-plane tunneling magnetoresistance (CPP-TMR) sensor having a resistance-area (RA) product less than 0.3 Ohm-$\mu m^2$.

12. A current-perpendicular-to-the-plane (CPP) giant magnetoresistive (GMR) read head structure for reading magnetically recorded data from tracks on a magnetic recording disk in a disk drive, the read head structure comprising:
    an air-bearing slider having an air-bearing surface (ABS) for facing the disk and a trailing surface generally orthogonal to the ABS;

a first shield layer of magnetically permeable material on the slider's trailing surface;

a GMR read head comprising a stack of layers on the first shield layer and having a front edge substantially at the ABS, a back edge recessed from the front edge, and two spaced-apart side edges that define a read head track-width (TW);

a damping layer on and in contact with at least one of (a) the side edges of the read head and (b) the back edge of the read head, the damping layer consisting essentially of an element selected from the group consisting of Pt, Pd, Os, La, Ce, Pr, Nd, Pm, Sm, Eu, Gd, Tb, Dy, Ho, Er, Th, Yb, and Lu;

an insulating layer on and in contact with the damping layer and on regions of the first shield layer adjacent the read head side edges;

a ferromagnetic biasing layer on the insulating layer; and a second shield layer of magnetically permeable material on the read head and the ferromagnetic biasing layer.

13. The read head structure of claim 12 wherein the damping layer consists essentially of an element selected from Pt, Pd, Gd, Dy, Tb and Ho.

14. The read head structure of claim 12 wherein the thickness of the damping layer is less than 101.

15. The read head structure of claim 14 wherein the damping layer is a discontinuous film.

16. The read head structure of claim 12 wherein the damping layer is on and in contact with both (a) the side edges of the read head and (b) the back edge of the read head.

17. A magnetoresistive sensor structure for sensing magnetically recorded data from a magnetic recording medium, the structure comprising:
a substrate;
a first shield layer of magnetically permeable material on the substrate;
a magnetoresistive sensor comprising a stack of layers on the first shield layer and having a front edge for facing a magnetic recording medium, a back edge recessed from the front edge, and two spaced-apart side edges that define a sensor track width (TW) at the front edge, the sensor being capable of sensing magnetically recorded data when a sense current is applied perpendicular to the planes of the layers in the sensor stack; and
an insulating layer on and in contact with the sensor side edges and on regions of the first shield layer adjacent the sensor side edges, wherein damping material is incorporated into the insulating layer, said damping material being selected from the group consisting of Pt, Pd, Os, La, Ce, Pr, Nd, Pm, Sm, Eu, Gd, Tb, Dy, Ho, Er, Th, Yb, and Lu.

18. The sensor structure of claim 17 wherein the damping material is a dopant in the material of the insulating layer in an amount less than 20 atomic percent.

* * * * *

UNITED STATES PATENT AND TRADEMARK OFFICE
CERTIFICATE OF CORRECTION

PATENT NO. : 8,576,519 B1
APPLICATION NO. : 13/649245
DATED : November 5, 2013
INVENTOR(S) : Matthew J. Carey et al.

It is certified that error appears in the above-identified patent and that said Letters Patent is hereby corrected as shown below:

In the Claims:

At column 9, line 25, in claim 14, delete the term "101" and replace with the term --10Å--.

Signed and Sealed this
Fourth Day of February, 2014

Michelle K. Lee
*Deputy Director of the United States Patent and Trademark Office*